(12) United States Patent
Lu et al.

(10) Patent No.: US 12,334,710 B2
(45) Date of Patent: Jun. 17, 2025

(54) PHOTONIC CRYSTAL SURFACE-EMITTING LASER (71) Applicants: Interface Technology (ChengDu) Co., Ltd., Sichuan (CN); Interface Optoelectronics (ShenZhen) Co., Ltd., Guangdong (CN); General Interface Solution Limited, Miaoli County (TW)

(72) Inventors: Tien-Chang Lu, Guangdong (CN); Kuo-Bin Hong, Guangdong (CN); Lih-Ren Chen, Guangdong (CN); Ten-Hsing Jaw, Guangdong (CN)

(73) Assignees: Interface Technology (ChengDu) Co., Ltd., Sichuan (CN); Interface Optoelectronics (ShenZhen) Co., Ltd., Guangdong (CN); General Interface Solution Limited, Miaoli County (TW)

( * ) Notice: Subject to any disclaimer, the term of this patent is extended or adjusted under 35 U.S.C. 154(b) by 720 days.

(21) Appl. No.: 17/448,706

(22) Filed: Sep. 24, 2021

(65) Prior Publication Data
US 2023/0055037 A1 Feb. 23, 2023

(30) Foreign Application Priority Data
Aug. 18, 2021 (CN) .......................... 202110948096.4

(51) Int. Cl.
*H01S 5/183* (2006.01)
*H01S 5/0225* (2021.01)
(Continued)

(52) U.S. Cl.
CPC .............. *H01S 5/11* (2021.01); *H01S 5/0225* (2021.01); *H01S 5/18391* (2013.01); *H01S 5/3416* (2013.01)

(58) Field of Classification Search
CPC ...... H01S 5/11; H01S 5/0225; H01S 5/18391; H01S 5/3416; H01S 5/04252;
(Continued)

(56) References Cited

U.S. PATENT DOCUMENTS

| 2002/0131464 A1* | 9/2002 | Sirbu | H01S 5/18308 372/45.01 |
| 2005/0063440 A1* | 3/2005 | Deppe | H01S 5/18327 372/50.1 |

(Continued)

OTHER PUBLICATIONS

Chiu et al., "Photonic Crystal Surface Emitting Lasers with Naturally Formed Periodic ITO Structures", ACS Photonics 2019 6 (3), pp. 684-690. (Year: 2019).*

(Continued)

*Primary Examiner* — Xinning (Tom) Niu
(74) *Attorney, Agent, or Firm* — CKC & Partners Co., LLC (57) ABSTRACT

A photonic crystal surface-emitting laser includes a substrate, an n-type cladding layer, an active layer, a photonic crystal structure, a p-type cladding layer, an n-type semiconductor layer and a meta-surface structure. The n-type cladding layer is disposed over the substrate. The active layer is disposed over the n-type cladding layer. The photonic crystal structure is disposed over the active layer. The p-type cladding layer is disposed over the photonic crystal structure. The n-type semiconductor layer is disposed over the p-type cladding layer. The meta-surface structure disposed on a surface of the n-type semiconductor layer away from the p-type cladding layer.

19 Claims, 9 Drawing Sheets

(51) Int. Cl.
*H01S 5/11* (2021.01)
*H01S 5/34* (2006.01)

(58) Field of Classification Search
CPC .... H01S 5/2009; H01S 2301/18; H01S 5/185; H01S 5/3095; H01S 5/18322; H01S 5/18377
See application file for complete search history.

(56) References Cited

U.S. PATENT DOCUMENTS

| | | | | |
|---|---|---|---|---|
| 2007/0242715 | A1* | 10/2007 | Gustavsson | H01S 5/18355 372/45.01 |
| 2012/0120977 | A1* | 5/2012 | Fattal | H01S 5/18363 372/50.1 |
| 2016/0020581 | A1* | 1/2016 | Hirose | H01S 3/08009 372/46.01 |

OTHER PUBLICATIONS

Neshev, D. and Aharonovich, I., "Optical metasurfaces: new generation building blocks for multi-functional optics.", Light Sci Appl 7, 58, 2018, pp. 1-5, https://doi.org/10.1038/s41377-018-0058-1.

* cited by examiner

PHOTONIC CRYSTAL SURFACE-EMITTING LASER

RELATED APPLICATIONS

This application claims priority to China Application Serial Number 202110948096.4, filed Aug. 18, 2021, the disclosure of which is incorporated herein by reference in its entirety.

BACKGROUND

Technical Field

The present disclosure relates to a photonic crystal surface-emitting laser.

Description of Related Art

Lasers are widely used in different fields such as medicine, optical communication and industrial processing. For convention lasers, there is still room for improvement in efficiency and output direction control.

SUMMARY

In view of the foregoing, one of the objects of the present disclosure is to provide a photonic crystal surface-emitting laser that can achieve higher efficiency and larger output angle.

To achieve the objective stated above, in accordance with an embodiment of the present disclosure, a photonic crystal surface-emitting laser includes a substrate, an n-type cladding layer, an active layer, a photonic crystal structure, a p-type cladding layer, a first n-type semiconductor layer and a meta-surface structure. The n-type cladding layer is disposed over the substrate. The active layer is disposed over the n-type cladding layer. The photonic crystal structure is disposed over the active layer. The p-type cladding layer is disposed over the photonic crystal structure. The first n-type semiconductor layer is disposed over the p-type cladding layer. The meta-surface structure disposed on a surface of the first n-type semiconductor layer away from the p-type cladding layer.

In one or more embodiments of the present disclosure, the substrate, the n-type cladding layer and the active layer are arranged along a first direction, and the meta-surface structure is configured to direct a laser beam to output at an angle to the first direction.

In one or more embodiments of the present disclosure, a maximum angle between the laser beam and the first direction is 90 degrees.

In one or more embodiments of the present disclosure, the meta-surface structure is configured to direct a laser beam to output at a plurality of different directions.

In one or more embodiments of the present disclosure, the meta-surface structure includes microstructures integrally formed with the first n-type semiconductor layer.

In one or more embodiments of the present disclosure, the meta-surface structure partially covers the surface of the first n-type semiconductor layer away from the p-type cladding layer, and the meta-surface structure is in contact with the first n-type semiconductor layer.

In one or more embodiments of the present disclosure, the photonic crystal surface-emitting laser further includes a metal electrode. The metal electrode is disposed on the surface of the first n-type semiconductor layer away from the p-type cladding layer, and the metal electrode is arranged around the meta-surface structure.

In one or more embodiments of the present disclosure, the photonic crystal surface-emitting laser further includes a tunnel junction disposed in the first n-type semiconductor layer.

In one or more embodiments of the present disclosure, a cross-sectional area of the tunnel junction is smaller than an area of the meta-surface structure.

In one or more embodiments of the present disclosure, an orthogonal projection area of the tunnel junction onto the substrate is located in an orthogonal projection area of the meta-surface structure onto the substrate.

In one or more embodiments of the present disclosure, the substrate, the n-type cladding layer and the active layer are arranged along a first direction. In a second direction normal to the first direction, a width of the tunnel junction is smaller than a width of the meta-surface structure.

In one or more embodiments of the present disclosure, a cross-sectional area of the tunnel junction is smaller than a cross-sectional area of the photonic crystal structure.

In one or more embodiments of the present disclosure, an orthogonal projection area of the tunnel junction onto the substrate is located in an orthogonal projection area of the photonic crystal structure onto the substrate.

In one or more embodiments of the present disclosure, the substrate, the n-type cladding layer and the active layer are arranged along a first direction. In a second direction normal to the first direction, a width of the tunnel junction is smaller than a width of the photonic crystal structure.

In one or more embodiments of the present disclosure, the photonic crystal surface-emitting laser further includes a first p-type semiconductor layer disposed over the p-type cladding layer and surrounded by the first n-type semiconductor layer. The tunnel junction is disposed between the first p-type semiconductor layer and the first n-type semiconductor layer.

In one or more embodiments of the present disclosure, the tunnel junction includes a second p-type semiconductor layer and a second n-type semiconductor layer. The second p-type semiconductor layer is located between the first p-type semiconductor layer and the second n-type semiconductor layer. The second p-type semiconductor layer has higher doping concentration than the first p-type semiconductor layer. The second n-type semiconductor layer has higher doping concentration than the first n-type semiconductor layer.

In one or more embodiments of the present disclosure, a thickness of the tunnel junction is within a range from 5 to 100 nm.

In one or more embodiments of the present disclosure, the photonic crystal surface-emitting laser further includes an electron blocking layer disposed between the active layer and the photonic crystal structure.

In one or more embodiments of the present disclosure, the photonic crystal structure includes a plurality of periodic holes.

In one or more embodiments of the present disclosure, the periodic holes have circular, quadrangular or hexagonal cross-sections.

In sum, the photonic crystal surface-emitting laser of the present disclosure includes a meta-surface structure disposed on a surface of the n-type semiconductor layer away from the p-type cladding layer to enable control of the output angle of the laser beam. The photonic crystal surface-emitting laser may further include a tunnel junction disposed in the n-type semiconductor layer. Having the tunnel junction can uniform the electric current passing through the laser, resulting in an improvement in the efficiency of the laser.

BRIEF DESCRIPTION OF THE DRAWINGS

To make the objectives, features, advantages, and embodiments of the present disclosure, including those mentioned above and others, more comprehensible, descriptions of the accompanying drawings are provided as follows.

DETAILED DESCRIPTION

For the completeness of the description of the present disclosure, reference is made to the accompanying drawings and the various embodiments described below. Various features in the drawings are not drawn to scale and are provided for illustration purposes only. To provide full understanding of the present disclosure, various practical details will be explained in the following descriptions. However, a person with an ordinary skill in relevant art should realize that the present disclosure can be implemented without one or more of the practical details. Therefore, the present disclosure is not to be limited by these details.

Figure 1A:
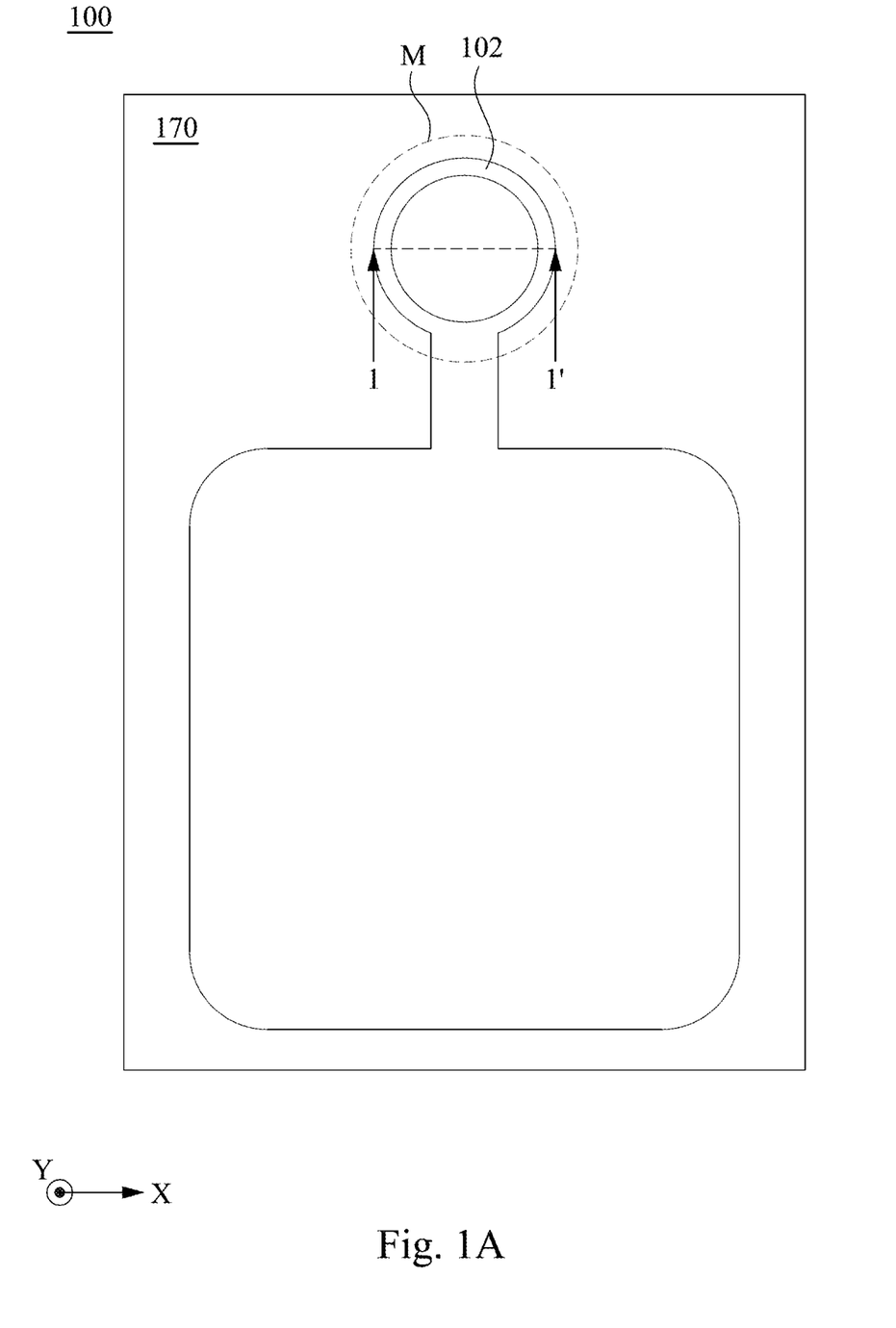
FIG. 1A illustrates a top view of a photonic crystal surface-emitting laser in accordance with an embodiment of the present disclosure.
Figure 1B:
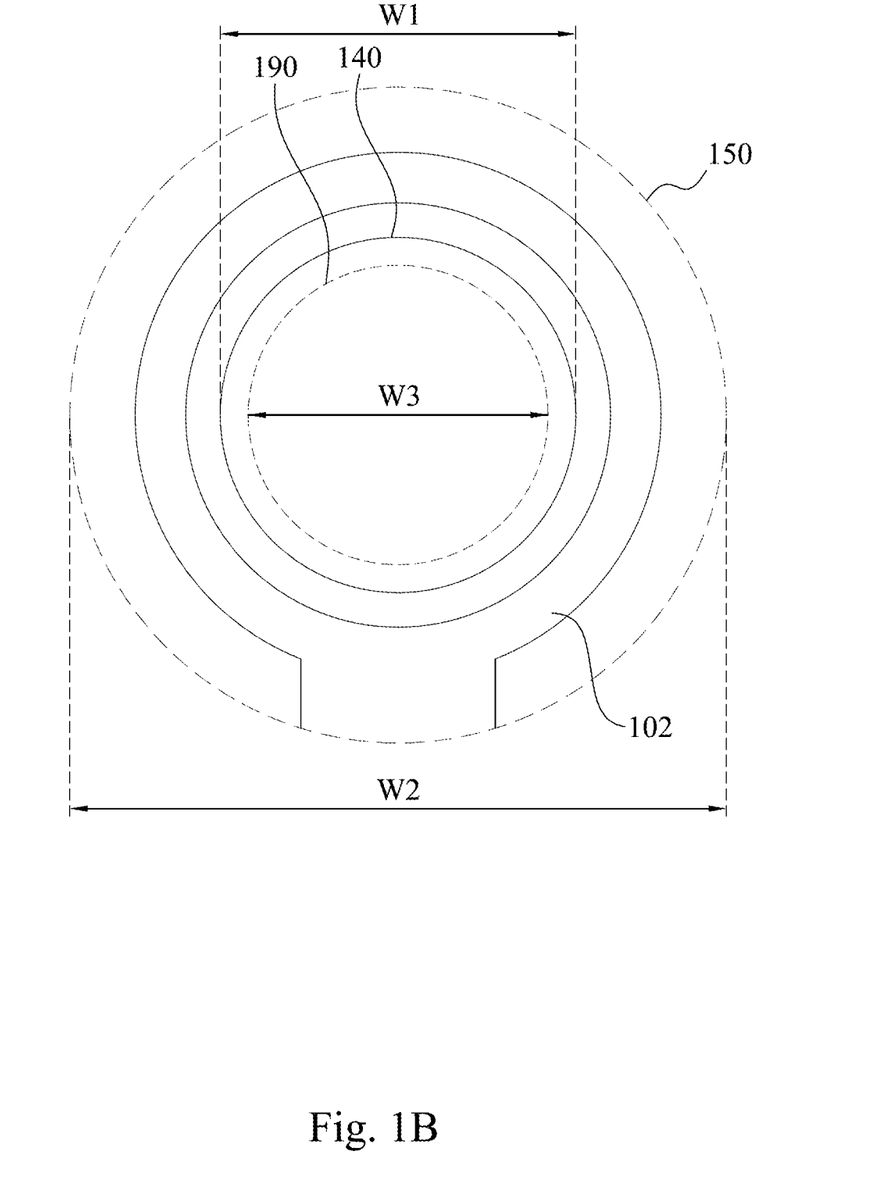
FIG. 1B illustrates an enlarged perspective view of the photonic crystal surface-emitting laser shown in FIG. 1A in the area M.
Figure 1C:
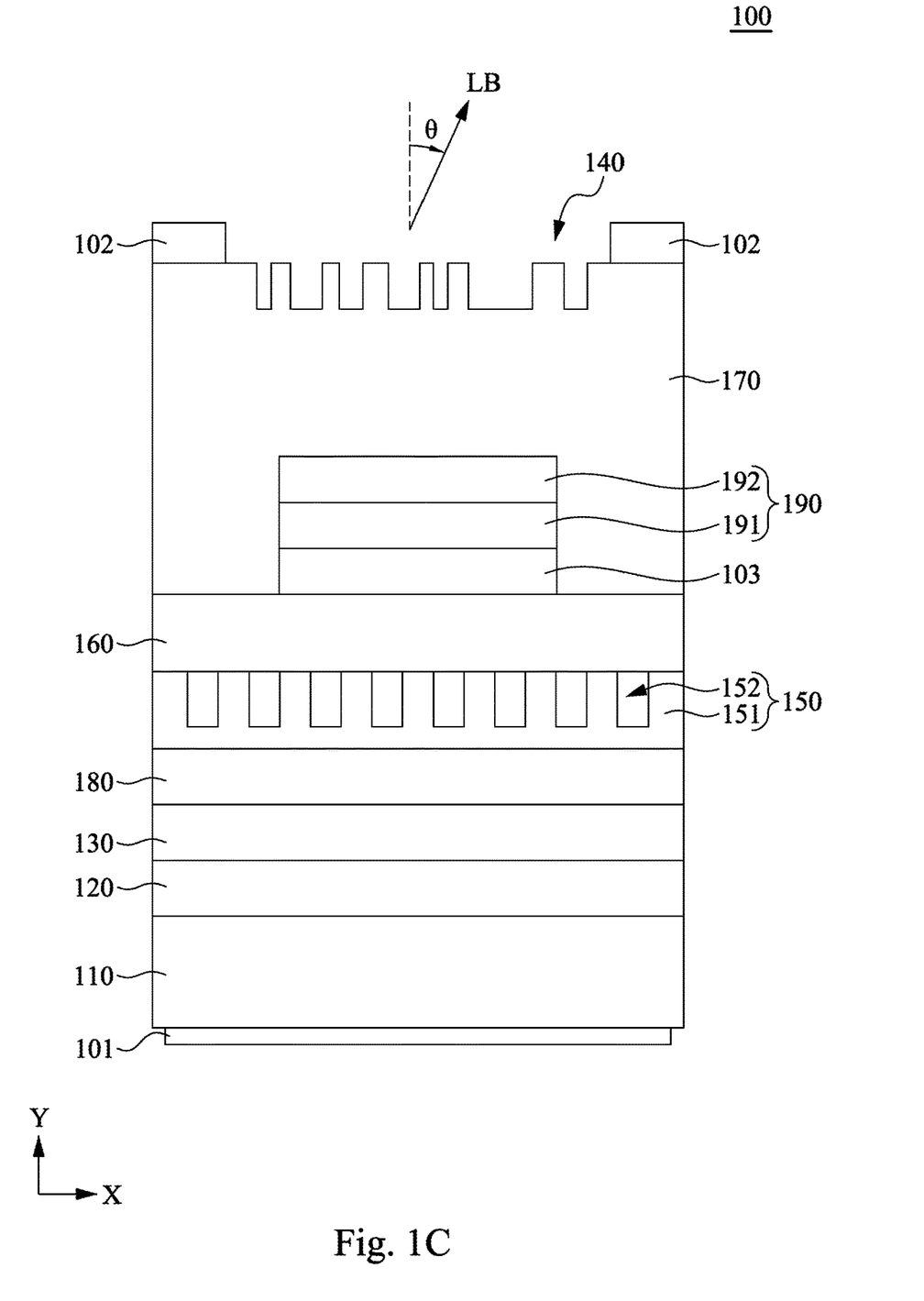
FIG. 1C illustrates a sectional view of the photonic crystal surface-emitting laser shown in FIG. 1A taken along line segment 1-1'.

Reference is made to FIGS. 1A to 1C. FIG. 1A illustrates a top view of a photonic crystal surface-emitting laser 100 in accordance with an embodiment of the present disclosure. FIG. 1B illustrates an enlarged perspective view of the photonic crystal surface-emitting laser 100 shown in FIG. 1A in the area M. FIG. 1C illustrates a sectional view of the photonic crystal surface-emitting laser 100 shown in FIG. 1A taken along line segment 1-1'. The photonic crystal surface-emitting laser 100 includes a substrate 110, an n-type cladding layer 120, an active layer 130, a photonic crystal structure 150, a p-type cladding layer 160, a first n-type semiconductor layer 170 and a meta-surface structure 140 in a stack arrangement along a first direction Y. The substrate 110 is, for example, a semiconductor substrate, which may include GaAs or other suitable semiconductor material. The n-type cladding layer 120 is disposed over the substrate 110. The active layer 130 is disposed over the n-type cladding layer 120. In some embodiments, the active layer 130 includes quantum well and is configured to emit light when a voltage is applied to the photonic crystal surface-emitting laser 100.

In some embodiments, the n-type cladding layer 120 may include GaAs, InGaAs, InGaAsP, AlAs, AlGaInAs, AlGaInP, AlGaAs, InGaNAs, GaAsSb, GaSb, InP, InAs, GaP, AlP, GaN, AlGaN, InGaN, AlInGaN, other suitable semiconductor material, or any combination thereof.

As shown in FIGS. 1A to 1C, the photonic crystal structure 150 is disposed over the active layer 130. The light emitted by the active layer 130 can resonate in the photonic crystal structure 150 and thereby produce a laser beam LB.

The laser beam LB is output from the top of the photonic crystal surface-emitting laser 100.

As shown in FIGS. 1A to 1C, in some embodiments, the photonic crystal structure 150 includes a base portion 151 and a plurality of periodic holes 152. The base portion 151 may include GaAs or other suitable semiconductor material. The periodic holes 152 are formed on a side of the base portion 151 away from the active layer 130. The periodic holes 152 are arranged in a second direction X substantially normal to the first direction Y. In some embodiments, the periodic holes 152 are arranged on a plane normal to the first direction Y. In some embodiments, the periodic holes 152 have circular, quadrangular or hexagonal cross-sections.

As shown in FIGS. 1A to 1C, the p-type cladding layer 160 is disposed over the photonic crystal structure 150. The first n-type semiconductor layer 170 is disposed over the p-type cladding layer 160. In some embodiments, the first n-type semiconductor layer 170 may include n-GaAs. In some embodiments, the p-type cladding layer 160 may include GaAs, InGaAs, InGaAsP, AlAs, AlGaInAs, AlGaInP, AlGaAs, InGaNAs, GaAsSb, GaSb, InP, InAs, GaP, AlP, GaN, AlGaN, InGaN, AlInGaN, other suitable semiconductor material, or any combination thereof.

As shown in FIGS. 1A to 1C, the meta-surface structure 140 is disposed on a surface of the first n-type semiconductor layer 170 away from the p-type cladding layer 160. The meta-surface structure 140 includes sub-wavelength microstructures and is configured to change the properties of the laser beam LB, such as wave front and phase, as the laser beam LB passes through the meta-surface structure 140. The meta-surface structure 140 enables control of the output angle of the laser beam LB from the top of the photonic crystal surface-emitting laser 100. For example, the meta-surface structure 140 may be configured to direct the laser beam LB to output at an angle to the first direction Y. In some embodiments, a maximum angle between the laser beam LB and the first direction Y is 90 degrees.

Depending on the arrangement of the meta-surface structure 140, an angle $\theta$ between the laser beam LB and the first direction Y may be any angle in the range from −90 degrees to +90 degrees. In some embodiments, the meta-surface structure 140 is configured to direct the laser beam LB produced by the photonic crystal structure 150 to output at a plurality of different directions from the top of the photonic crystal surface-emitting laser 100.

In some embodiments, the meta-surface structure 140 includes microstructures integrally formed with the first n-type semiconductor layer 170. In some embodiments, the meta-surface structure 140 may be formed by etching the surface of the first n-type semiconductor layer 170 away from the p-type cladding layer 160.

In some embodiments, the meta-surface structure 140 is an additional layer attached to the surface of the first n-type semiconductor layer 170 away from the p-type cladding layer 160. The meta-surface structure 140 partially covers the surface of the first n-type semiconductor layer 170 away from the p-type cladding layer 160, and the meta-surface structure 140 is in contact with the first n-type semiconductor layer 170. In some embodiments, the meta-surface structure 140 may be formed by coating a layer of dielectric material or semiconductor material (e.g., amorphous silicon) on the surface of the first n-type semiconductor layer 170 away from the p-type cladding layer 160.

As shown in FIGS. 1A to 1C, in some embodiments, the photonic crystal surface-emitting laser 100 further includes a tunnel junction 190 disposed in the first n-type semiconductor layer 170. Having the tunnel junction 190 can uniform the electric current passing through the photonic crystal surface-emitting laser 100, resulting in an improvement in the efficiency of the photonic crystal surface-emitting laser 100.

As shown in FIGS. 1A to 1C, in some embodiments, a cross-sectional area of the tunnel junction 190 (specifically, the area of the cross-section of the tunnel junction 190 that is normal to the first direction Y) is smaller than an area of the meta-surface structure 140. In some embodiments, the cross-sectional area of the tunnel junction 190 is smaller than a cross-sectional area of the photonic crystal structure 150 (specifically, the area of the cross-section of the photonic crystal structure 150 that is normal to the first direction Y). In some embodiments, an orthogonal projection area of the tunnel junction 190 onto the substrate 110 is located in an orthogonal projection area of the meta-surface structure 140 onto the substrate 110, in which "orthogonal projection area" refers to the area of projection along the opposite direction of the first direction Y. In some embodiments, the orthogonal projection area of the tunnel junction 190 onto the substrate 110 is located in an orthogonal projection area of the photonic crystal structure 150 onto the substrate 110. In some embodiments, a width of the tunnel junction W3 is smaller than a width W1 of the meta-surface structure 140 in the second direction X. In some embodiments, the width of the tunnel junction W3 is smaller than a width W2 of the photonic crystal structure 150 in the second direction X. In some embodiments, a thickness of the tunnel junction 190 is within a range from 5 to 100 nm in the first direction Y.

As shown in FIGS. 1A to 1C, the main portion that produces light is the portion of the photonic crystal structure 150 beneath the tunnel junction 190. The meta-surface structure 140 has a range that covers the tunnel junction 190 (i.e., the orthogonal projection area of the tunnel junction 190 onto the substrate 110 is located in the orthogonal projection area of the meta-surface structure 140 onto the substrate 110). Accordingly, the meta-surface structure 140 also covers the portion of the photonic crystal structure 150 beneath the tunnel junction 190, allowing the meta-surface structure 140 to control the output angle of the laser beam LB from the top of the photonic crystal surface-emitting laser 100.

As shown in FIGS. 1A to 10, in some embodiments, the photonic crystal surface-emitting laser 100 further includes a first p-type semiconductor layer 103 (e.g., p-GaAs) disposed over the p-type cladding layer 160 and surrounded by the first n-type semiconductor layer 170. The tunnel junction 190 is disposed between the first p-type semiconductor layer 103 and the first n-type semiconductor layer 170.

As shown in FIGS. 1A to 1C, in some embodiments, the tunnel junction 190 includes a second p-type semiconductor layer 191 and a second n-type semiconductor layer 192. The second p-type semiconductor layer 191 is located between the first p-type semiconductor layer 103 and the second n-type semiconductor layer 192. The second p-type semiconductor layer 191 has higher doping concentration than the first p-type semiconductor layer 103. The second n-type semiconductor layer 192 has higher doping concentration than the first n-type semiconductor layer 170. In some embodiments, the second p-type semiconductor layer 191 and the second n-type semiconductor layer 192 include GaAs or InGaAs.

As shown in FIGS. 1A to 1C, in some embodiments, the photonic crystal surface-emitting laser 100 further includes an electron blocking layer 180 covering the active layer 130. The electron blocking layer 180 is disposed over the active layer 130 and is located between the photonic crystal structure 150 and the active layer 130.

As shown in FIGS. 1A to 1C, in some embodiments, the photonic crystal surface-emitting laser 100 further includes a first electrode 101 and a second electrode 102. The first electrode 101 is disposed on a side of the substrate 110 away from the n-type cladding layer 120, and the first electrode 101 is in contact with a surface of the substrate 110 away from the n-type cladding layer 120. The second electrode 102 is disposed on a side of the first n-type semiconductor layer 170 away from the p-type cladding layer 160, and the second electrode 102 is in contact with a surface of the first n-type semiconductor layer 170 away from the p-type cladding layer 160. In some embodiments, the first and second electrodes 101 and 102 are metal electrodes. In some embodiments, the second electrode 102 is arranged around the meta-surface structure 140.

In some embodiments, the first and second electrodes 101 and 102 may include In, Sn, Al, Au, Pt, Zn, Ge, Ag, Pb, Pd, Cu, AuBe, BeGe, Ni, PbSn, Cr, AuZn, Ti, W, TiW, other suitable electrically conductive material, or any combination thereof.

A method for manufacturing the photonic crystal surface-emitting laser 100 will be described below with reference to FIGS. 2 to 7.

Reference is made to FIGS. 2 to 7, which illustrate sectional views of the photonic crystal surface-emitting laser 100 of FIG. 1C at various stages of manufacturing. The method for manufacturing the photonic crystal surface-emitting laser 100 includes step S1 to S13.

Figure 2:
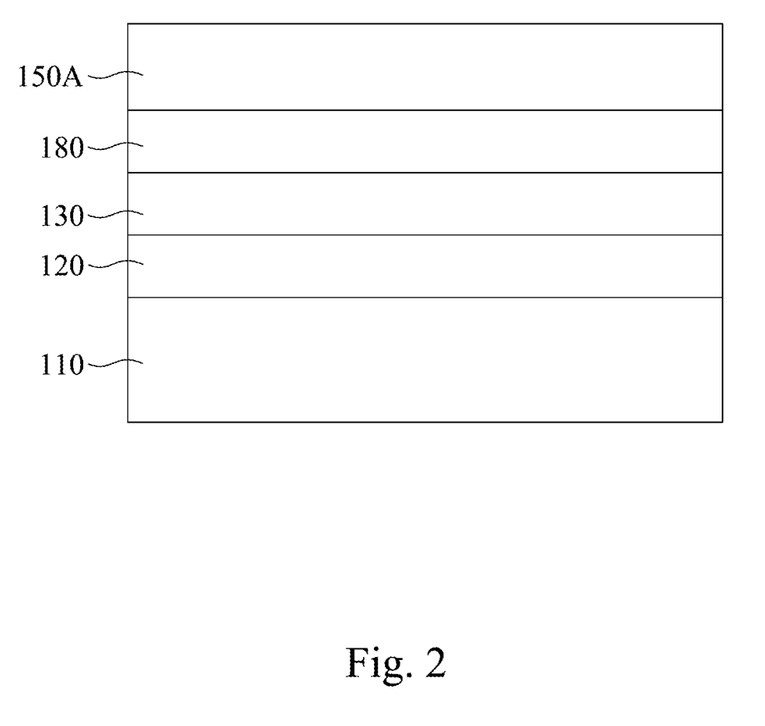
FIGS. 2-7 illustrate sectional views of the photonic crystal surface-emitting laser of FIG. 1C at various stages of manufacturing.

As shown in FIG. 2, the method for manufacturing the photonic crystal surface-emitting laser 100 commences at step S1, which includes forming the substrate 110, the n-type cladding layer 120, the active layer 130, the electron blocking layer 180 and a semiconductor layer 150A (e.g., GaAs). The substrate 110, the n-type cladding layer 120, the active layer 130, the electron blocking layer 180 and the semiconductor layer 150A are in a stack arrangement along the first direction Y. In some embodiments, step S1 includes forming the substrate 110, the n-type cladding layer 120, the active layer 130, the electron blocking layer 180 and the semiconductor layer 150A by means of epitaxial growth.

Figure 3:
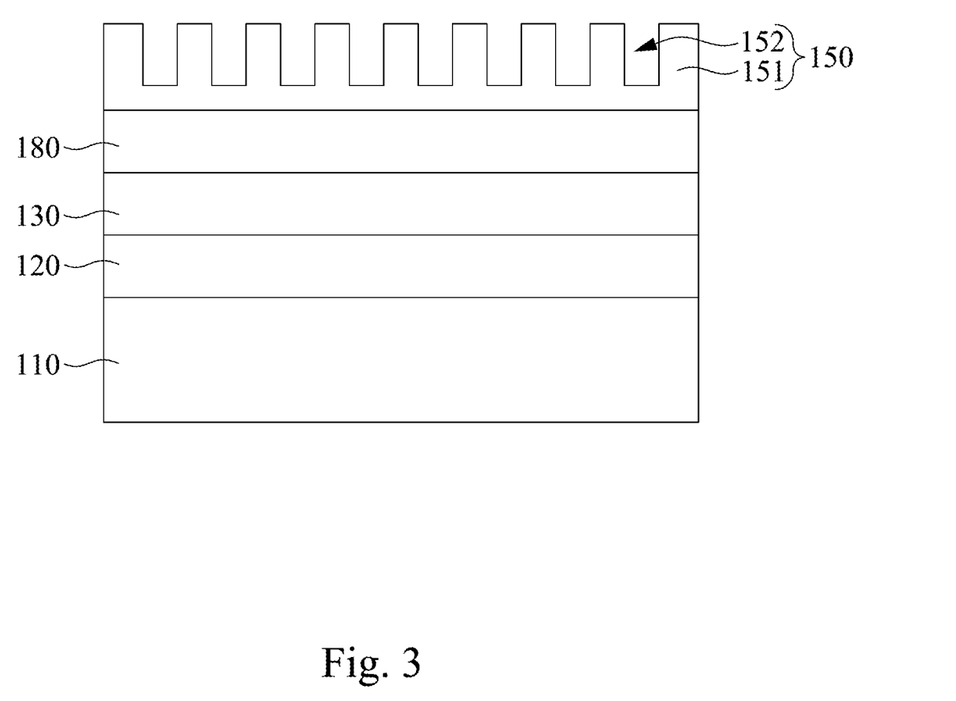

As shown in FIG. 3, the method for manufacturing the photonic crystal surface-emitting laser 100 continues to step S3, which includes forming the photonic crystal structure 150 in the semiconductor layer 150A. In some embodiments, step S3 includes removing part of the semiconductor layer 150A to form the periodic holes 152 of the photonic crystal structure 150. The remaining part of the semiconductor layer 150A becomes the base portion 151 of the photonic crystal structure 150. In some embodiments, step S3 includes removing part of the semiconductor layer 150A to form the periodic holes 152 of the photonic crystal structure 150 by means of etching or lithography.

Figure 4:
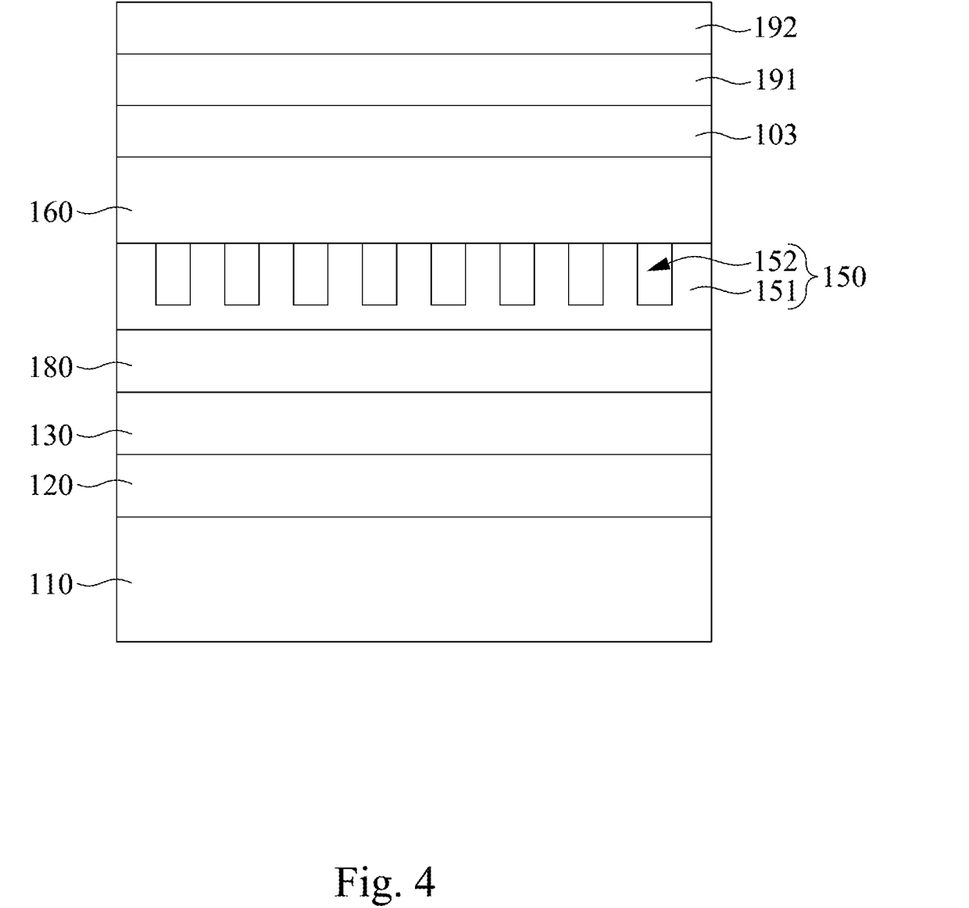

As shown in FIG. 4, the method for manufacturing the photonic crystal surface-emitting laser 100 continues to step S5, which includes forming the p-type cladding layer 160, the first p-type semiconductor layer 103 (e.g., p-GaAs), the second p-type semiconductor layer 191 (e.g., p+-GaAs or p+-InGaAs) and the second n-type semiconductor layer 192 (e.g., n+-GaAs or n+-InGaAs) over the photonic crystal structure 150. The p-type cladding layer 160, the first p-type semiconductor layer 103, the second p-type semiconductor layer 191 and the second n-type semiconductor layer 192 are in a stack arrangement along the first direction Y. The first p-type semiconductor layer 103 covers a top surface of the p-type cladding layer 160. The second p-type semiconductor layer 191 covers a top surface of the first p-type semiconductor layer 103. The second n-type semiconductor layer 192 covers a top surface of the second p-type semiconductor layer 191.

In some embodiments, step S5 includes forming the p-type cladding layer 160, the first p-type semiconductor layer 103, the second p-type semiconductor layer 191 and the second n-type semiconductor layer 192 over the photonic crystal structure 150 by means of epitaxial growth.

Figure 5:
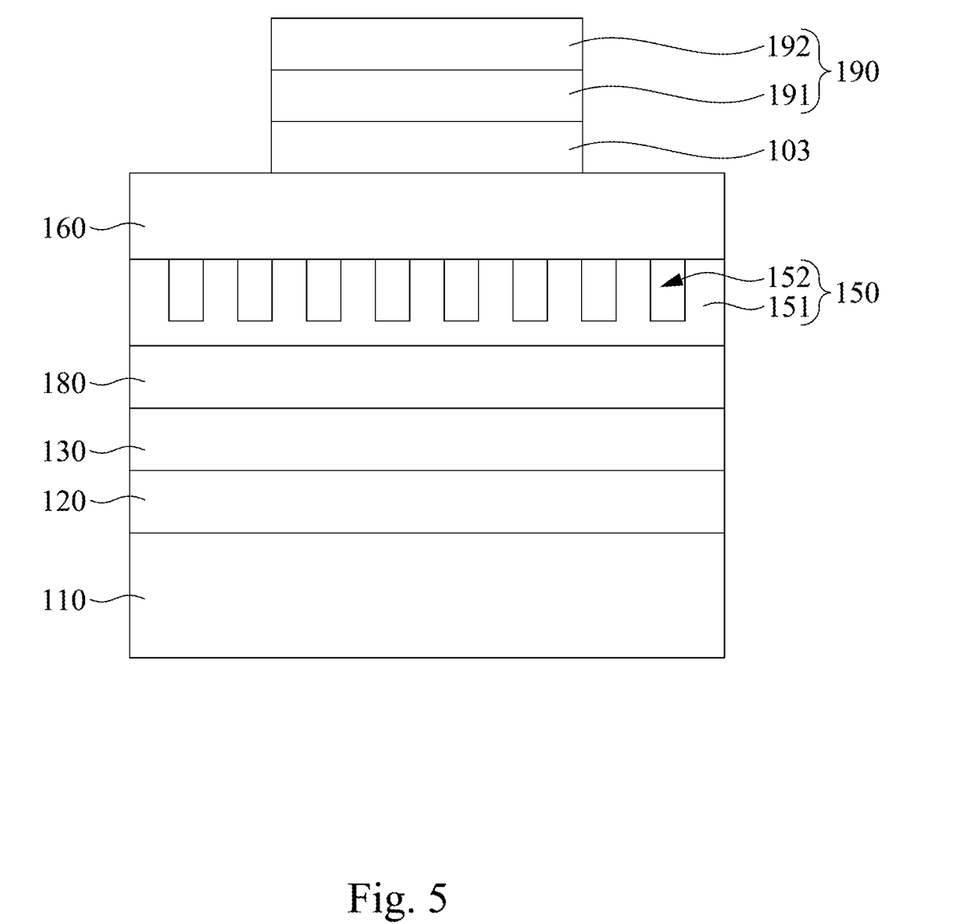

As shown in FIG. 5, the method for manufacturing the photonic crystal surface-emitting laser 100 continues to step S7, which includes removing the peripheral regions of the first p-type semiconductor layer 103, the second p-type semiconductor layer 191 and the second n-type semiconductor layer 192, such that the first p-type semiconductor layer 103, the second p-type semiconductor layer 191 and the second n-type semiconductor layer 192 become narrower than the p-type cladding layer 160 in the second direction X. The remaining part of the second p-type semiconductor layer 191 and the second n-type semiconductor layer 192 forms the tunnel junction 190, which defines a light emitting area of the photonic crystal surface-emitting laser 100.

In some embodiments, step S7 includes removing the peripheral regions of the first p-type semiconductor layer 103, the second p-type semiconductor layer 191 and the second n-type semiconductor layer 192 by means of etching, such that the first p-type semiconductor layer 103, the second p-type semiconductor layer 191 and the second n-type semiconductor layer 192 become narrower than the p-type cladding layer 160 in the second direction X.

Figure 6:
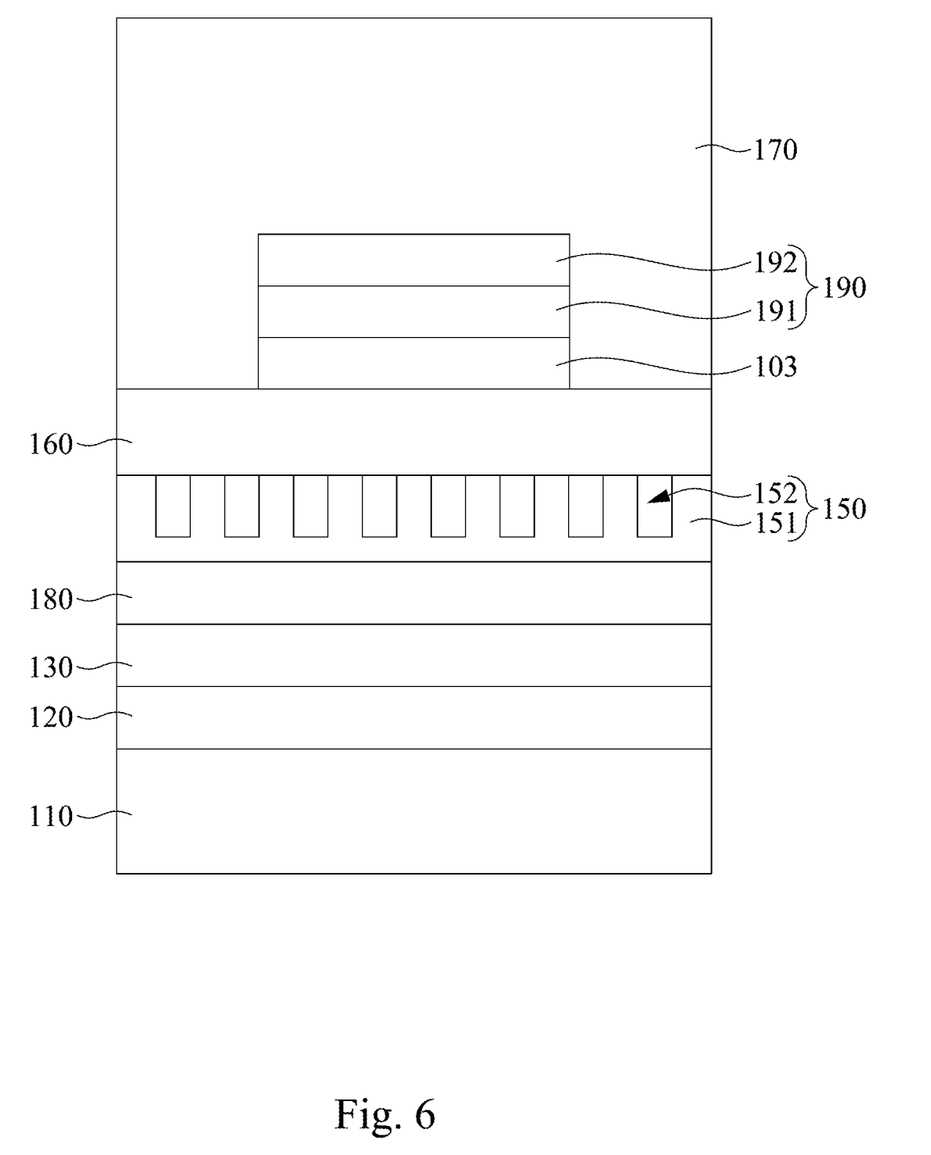

As shown in FIG. 6, the method for manufacturing the photonic crystal surface-emitting laser 100 continues to step S9, which includes forming the first n-type semiconductor layer 170. The first n-type semiconductor layer 170 is disposed over the p-type cladding layer 160 and wraps around the first p-type semiconductor layer 103, the second p-type semiconductor layer 191 and the second n-type semiconductor layer 192.

In some embodiments, step S9 includes forming the first n-type semiconductor layer 170 over the p-type cladding layer 160, the first p-type semiconductor layer 103, the second p-type semiconductor layer 191 and the second n-type semiconductor layer 192 by means of epitaxial growth.

Figure 7:
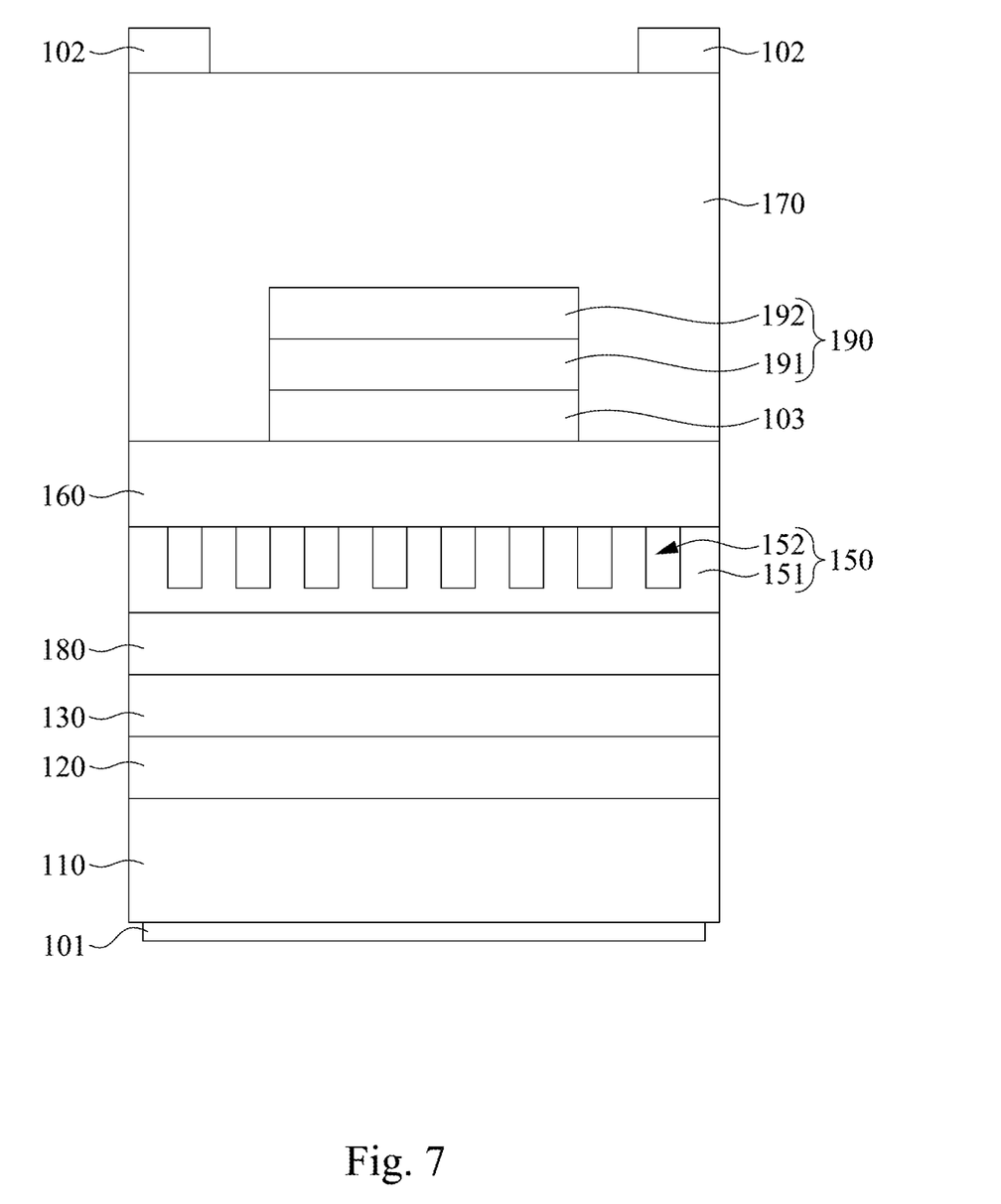

As shown in FIG. 7, the method for manufacturing the photonic crystal surface-emitting laser 100 continues to step S11, which includes forming the first and second electrodes 101 and 102. The first electrode 101 is disposed on the side of the substrate 110 away from the n-type cladding layer 120, and the first electrode 101 is in contact with the surface of the substrate 110 away from the n-type cladding layer 120. The second electrode 102 is disposed on the side of the first n-type semiconductor layer 170 away from the p-type cladding layer 160, and the second electrode 102 is in contact with the surface of the first n-type semiconductor layer 170 away from the p-type cladding layer 160.

Returning to FIG. 1C, the method for manufacturing the photonic crystal surface-emitting laser 100 concludes at step S13, which includes forming the meta-surface structure 140 on the surface of the first n-type semiconductor layer 170 away from the p-type cladding layer 160. In some embodiments, step S13 includes etching the surface of the first n-type semiconductor layer 170 away from the p-type cladding layer 160 to form the meta-surface structure 140. In some embodiments, step S13 includes coating a layer of dielectric material or semiconductor material (e.g., amorphous silicon) on the surface of the first n-type semiconductor layer 170 away from the p-type cladding layer 160 to form the meta-surface structure 140.

In sum, the photonic crystal surface-emitting laser of the present disclosure includes a meta-surface structure disposed on a surface of the n-type semiconductor layer away from the p-type cladding layer to enable control of the output angle of the laser beam. The photonic crystal surface-emitting laser may further include a tunnel junction disposed in the n-type semiconductor layer. Having the tunnel junction can uniform the electric current passing through the laser, resulting in an improvement in the efficiency of the laser.

Although the present disclosure has been described by way of the exemplary embodiments above, the present disclosure is not to be limited to those embodiments. Any person skilled in the art can make various changes and modifications without departing from the spirit and the scope of the present disclosure. Therefore, the protective scope of the present disclosure shall be the scope of the claims as attached.

What is claimed is:

1. A photonic crystal surface-emitting laser, comprising:
   a substrate;
   an n-type cladding layer disposed over the substrate;
   an active layer disposed over the n-type cladding layer;
   a photonic crystal structure disposed over the active layer;
   a p-type cladding layer disposed over the photonic crystal structure;
   a first n-type semiconductor layer disposed over the p-type cladding layer; and
   a meta-surface structure disposed on a surface of the first n-type semiconductor layer away from the p-type cladding layer, wherein the meta-surface structure is an additional layer attached to and in contact with the surface of the first n-type semiconductor layer away from the p-type cladding layer.

2. The photonic crystal surface-emitting laser of claim 1, wherein the substrate, the n-type cladding layer and the active layer are arranged along a first direction, and the meta-surface structure is configured to direct a laser beam to output at an angle to the first direction.

3. The photonic crystal surface-emitting laser of claim 2, wherein a maximum angle between the laser beam and the first direction is 90 degrees.

4. The photonic crystal surface-emitting laser of claim 1, wherein the meta-surface structure is configured to direct a laser beam to output at a plurality of different directions.

5. The photonic crystal surface-emitting laser of claim 1, wherein the meta-surface structure partially covers the surface of the first n-type semiconductor layer away from the p-type cladding layer.

6. The photonic crystal surface-emitting laser of claim 1, further comprising a metal electrode, wherein the metal electrode is disposed on the surface of the first n-type semiconductor layer away from the p-type cladding layer, and the metal electrode is arranged around the meta-surface structure.

7. The photonic crystal surface-emitting laser of claim 1, further comprising a tunnel junction disposed in the first n-type semiconductor layer.

8. The photonic crystal surface-emitting laser of claim 7, wherein a cross-sectional area of the tunnel junction is smaller than an area of the meta-surface structure.

9. The photonic crystal surface-emitting laser of claim 7, wherein an orthogonal projection area of the tunnel junction onto the substrate is located in an orthogonal projection area of the meta-surface structure onto the substrate.

10. The photonic crystal surface-emitting laser of claim 7, wherein the substrate, the n-type cladding layer and the active layer are arranged along a first direction, in a second direction normal to the first direction, a width of the tunnel junction is smaller than a width of the meta-surface structure.

11. The photonic crystal surface-emitting laser of claim 7, wherein a cross-sectional area of the tunnel junction is smaller than a cross-sectional area of the photonic crystal structure.

12. The photonic crystal surface-emitting laser of claim 7, wherein an orthogonal projection area of the tunnel junction onto the substrate is located in an orthogonal projection area of the photonic crystal structure onto the substrate.

13. The photonic crystal surface-emitting laser of claim 7, wherein the substrate, the n-type cladding layer and the active layer are arranged along a first direction, in a second direction normal to the first direction, a width of the tunnel junction is smaller than a width of the photonic crystal structure.

14. The photonic crystal surface-emitting laser of claim 7, further comprising a first p-type semiconductor layer disposed over the p-type cladding layer and surrounded by the first n-type semiconductor layer, wherein the tunnel junction is disposed between the first p-type semiconductor layer and the first n-type semiconductor layer.

15. The photonic crystal surface-emitting laser of claim 14, wherein the tunnel junction comprises a second p-type semiconductor layer and a second n-type semiconductor layer, the second p-type semiconductor layer is located between the first p-type semiconductor layer and the second n-type semiconductor layer, wherein the second p-type semiconductor layer has higher doping concentration than the first p-type semiconductor layer, and the second n-type semiconductor layer has higher doping concentration than the first n-type semiconductor layer.

16. The photonic crystal surface-emitting laser of claim 7, wherein a thickness of the tunnel junction is within a range from 5 to 100 nm.

17. The photonic crystal surface-emitting laser of claim 1, further comprising an electron blocking layer disposed between the active layer and the photonic crystal structure.

18. The photonic crystal surface-emitting laser of claim 1, wherein the photonic crystal structure comprises a plurality of periodic holes.

19. The photonic crystal surface-emitting laser of claim 18, wherein the periodic holes have circular, quadrangular or hexagonal cross-sections.

* * * * *